United States Patent [19]

Nuefeld

[11] Patent Number: 4,470,568
[45] Date of Patent: Sep. 11, 1984

[54] METHOD FOR CHANGING THE SPIN RATE OF A SPINNING BODY

[75] Inventor: Murray J. Nuefeld, Studio City, Calif.

[73] Assignee: Hughes Aircraft Company, El Segundo, Calif.

[21] Appl. No.: 184,866

[22] Filed: Sep. 8, 1980

Related U.S. Application Data

[60] Continuation of Ser. No. 880,929, Feb. 24, 1978, abandoned, which is a continuation of Ser. No. 660,089, Feb. 23, 1976, abandoned, which is a division of Ser. No. 551,206, Feb. 19, 1975, Pat. No. 3,996,804.

[51] Int. Cl.³ .................................................. B64G 1/24
[52] U.S. Cl. ..................................... 244/164; 244/169
[58] Field of Search ............... 244/164, 165, 167, 169, 244/170, 171, 3.2, 3.21, 3.22, 3.23; 74/5.43, 5.44

[56] References Cited

U.S. PATENT DOCUMENTS 3,135,479  6/1964  Badewitz .............................. 244/169
3,516,623  6/1970  Sinden ................................. 244/169

FOREIGN PATENT DOCUMENTS 2040513  8/1980  United Kingdom ................. 244/170

Primary Examiner—Charles E. Frankfort
Attorney, Agent, or Firm—E. F. Oberheim; A. W. Karambelas

[57] ABSTRACT

A method for changing the spin rate of a spinning spacecraft having a dynamic balancing mechanism which utilizes the communications channel between the spacecraft and the receiving terminal, the master index pulse generator on the spacecraft, and the spacecraft axial thrusters. To change the spin rate, a dynamic imbalance of a known wobble angle and phase is introduced by the dynamic balancing mechanism. An axial thruster is then fired for a predetermined time interval thereby coupling a portion of the axial thrust force into the rotational energy of the spinning body.

3 Claims, 5 Drawing Figures

METHOD FOR CHANGING THE SPIN RATE OF A SPINNING BODY

This is a continuation of application Ser. No. 880,929 filed Feb. 24, 1978, now abandoned, which was a continuation of application Ser. No. 660,089, filed Feb. 23, 1976, now abandoned, which was a division of Ser. No. 551,206, filed Feb. 19, 1975, now U.S. Pat. No. 3,996,804.

FIELD OF THE INVENTION

This invention relates to control systems and more specifically to control systems for spinning bodies.

DESCRIPTION OF THE PRIOR ART

In present communication satellites with their narrow beam high gain antennas and associated pointing accuracy requirements, the control and stability of the spacecraft's attitude is of extreme importance. There exists in the prior art several means and methods of controlling and stabilizing the spacecraft's attitude.

One important effect upon spacecraft attitude is the dynamic balance of the spacecraft. Dynamic imbalance causes the spacecraft to wobble at spin frequency thereby deleteriously affecting the communication channel. To reduce the effects of dynamic imbalance, spacecraft are dynamically balanced during ground test. However, no matter how well dynamic balance is achieved during ground test, there is always some dynamic imbalance present in the spacecraft after ascent to its designated in-orbit position. These dynamic imbalances can be introduced by the char distribution in the apogee motor or by expending a portion of the liquid fuel for the thrusters.

The first step in eliminating dynamic imbalance is the step of determining the phase and magnitude of the dynamic imbalance. There does exist in the prior art several means for measuring the dynamic imbalance so that it can be eliminated. These means include such things as accelerometers and gyroscopes mounted in the spacecraft. These devices directly sense the dynamic imbalance and the information from them is transmitted to an earth station for analysis. Since this type of direct sensing of the dynamic imbalance requires long-lived reliable components and adds to the weight of the spacecraft, it is an undesirable method.

Therefore, methods have been developed which are done remotely in a maintainable ground environment and do not add to the weight of the spacecraft. These include an interferometer method and an FM method.

The interferometer method requires that the spacecraft have two antennas separated axially a known distance. The two signals from the two antennas are received on a single receiver and antenna. From the variation in the interference pattern of the two received signals, the wobble angle magnitude and phase is calculated. This method is disadvantageous because it can only be utilized with spacecraft having two antennas separated axially. Furthermore, the measurement of the variation in the interference pattern requires very complex equipment. Also, the calculations required are relatively complex to determine the wobble angle.

The FM method measures the amount of frequency modulation present on the received signal as a result of the wobble. From the frequency modulation measurements, the wobble angle can be calculated. Since the wobble angle is typically very small, the amount of frequency modulation is very small and requires very sophisticated equipment to detect and measure. Also, the calculations required are complicated by the need to separate the FM component due to static unbalance from the FM component of the dynamic imbalance.

Another important effect upon spacecraft attitude is caused by solar pressure. This low level torque only manifests itself after the spacecraft is in orbit. Since solar pressure is a low-level in-flight force, it cannot be practically measured during ground testing and can only be predicted based upon a mathematical model. Presently, solar pressure is compensated for by designing the spacecraft surface and mass properties such that the predicted solar torque from the mathematical model has a minimal effect upon the spacecraft attitude in flight. Since this method is based upon a mathematical model which can be incorrect, it is not a wholly adequate solution.

Another factor which has an indirect effect upon attitude is the spin rate of the spacecraft. If the spin rate becomes too high or too low, it will fall outside of the response bandwidth of the attitude control system thereby resulting in a loss of control. With today's long mission lifetimes, this effect is a real possibility. In the prior art, spin rate control has been traditionally provided by jets placed tangentially to the spin axis. This means provides positive control but has at least two disadvantages. The first disadvantage is that it adds to the weight of the spacecraft. Secondly and perhaps the most significant disadvantage is that if such a control system fails and a jet is held on, a complete mission failure will result.

It is an object of the present invention to provide a method for changing the spin rate of a spinning body which does not appreciably add to the weight of the spinning body.

SUMMARY OF THE INVENTION

In keeping with the principle of the present invention, the objects are accomplished by utilizing the communications channel between the spacecraft and the receiving terminal, the master index pulse generator on the spacecraft, the spacecraft axial thrusters, and a dynamic balancing means in the spacecraft. To measure the dynamic imbalance, the received signal strength is plotted on a strip chart recorder relative to the master index pulse. The peak-to-peak variation in the plotted signal strength is proportional to twice the magnitude of the wobble angle of the spacecraft created by the dynamic imbalance. This magnitude is calculated by dividing one-half of the peak-to-peak variation by the gain-slope characteristic of the transmitting antenna on the spacecraft. The phase of the wobble angle relative to the master index pulse (MIP) is equal to the time interval between the occurrence of an MIP and either a peak or trough in the plotted received signal divided by the time required for the spacecraft to make a single revolution about its spin axis.

To change the spin rate, the means for dynamically balancing the spacecraft is utilized in reverse. It is used to introduce a known dynamic imbalance in the spacecraft. Introducing a dynamic imbalance causes the spacecraft to spin about a now apparent principal axis which is at an angle to the spin axis of the spacecraft. Therefore, there is an angle between the direction of thrust of an axial thruster and the apparent principal axis. Since there is an angle between the axial thruster and the apparent principal axis and the axial thruster is radially displaced from the central axis, a tangential component of the thrust from the axial thruster is coupled to the spacecraft in a direction to produce a spin-rate-changing torque which changes the spin rate about the apparent principal axis.

To change the center of gravity of the spacecraft thereby minimizing or compensating for the effects of molar pressure, the dynamic balancing means must be of the type which comprises a plurality of axially movable masses. To change the center of gravity, the axially movable masses are moved in unison in either axial direction thereby shifting the center of gravity of the spacecraft in that direction. The direction of movement is chosen to be toward the center of solar pressure. Therefore, as the center of gravity moves closer to the center of solar pressure, the moment arm between the center of gravity and center of solar pressure is decreased thereby reducing the solar torque, as a result of differential solar pressure, about the center of gravity of the spacecraft.

BRIEF DESCRIPTION OF THE DRAWINGS

The above-mentioned and other features and objects of the present invention will become more apparent by reference to the following description taken in conjunction with the accompanying drawings wherein like reference numerals denote like elements and in which.

DESCRIPTION OF THE PREFERRED EMBODIMENTS

Figure 1:
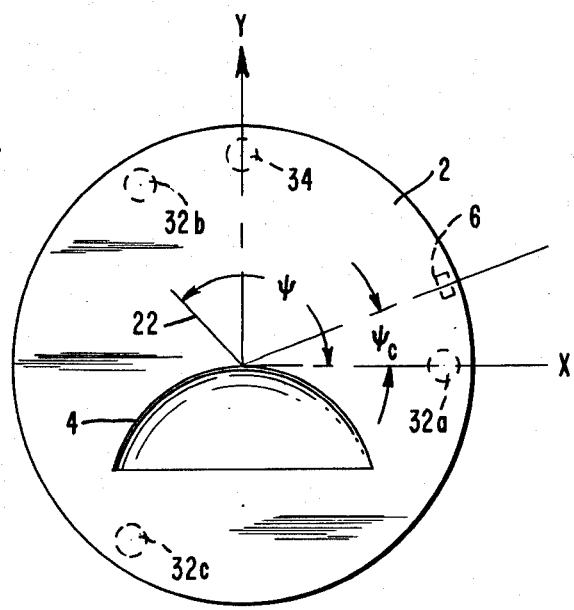
FIG. 1 is a plan view of a spinning body in accordance with the teachings of the present invention.
Figure 2:
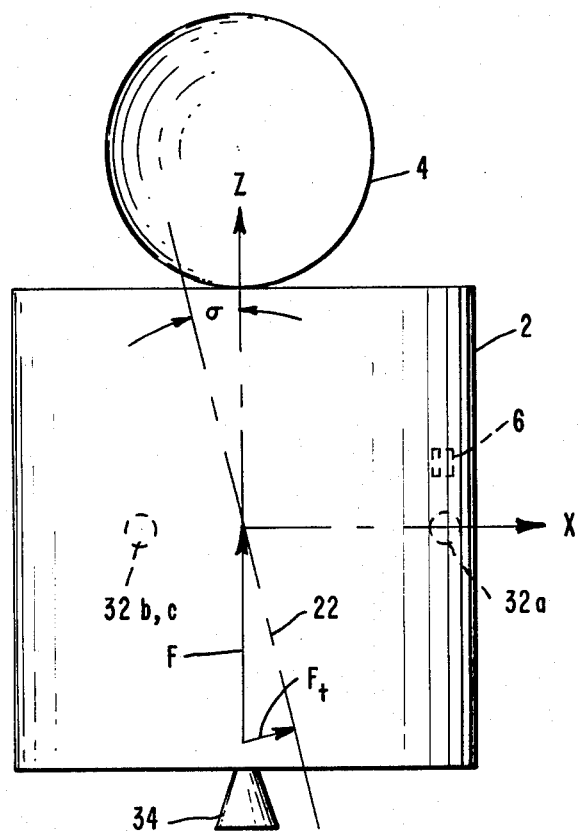
FIG. 2 is an elevation view of a spinning body in accordance with the teachings of the present invention.
Figure 4:
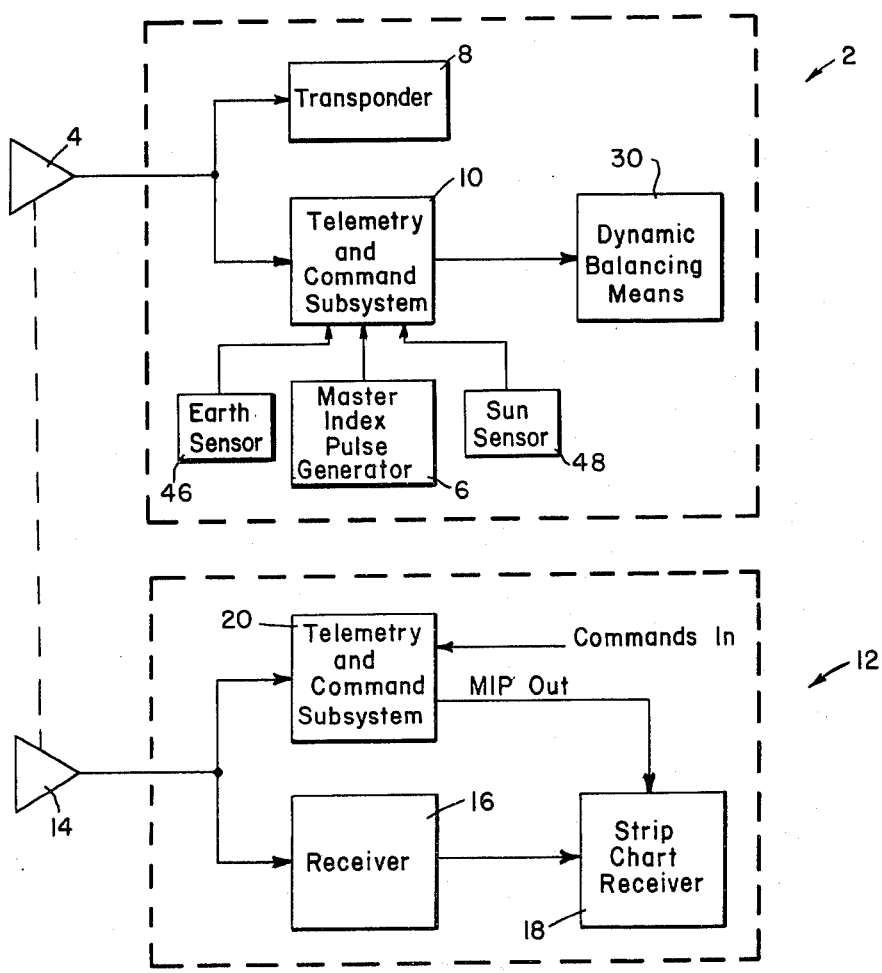
FIG. 4 is a simplified block diagram of a control loop in accordance with the teachings of the present invention.

Referring more specifically to the drawings. FIGS. 1 and 2 are respectively a plan view and an elevation view of a spinning body in accordance with the teachings of the present invention. FIG. 4 is a simplified block diagram of a control loop in accordance with the teaching of the present invention. FIG. 1, FIG. 2 and FIG. 4, taken together, contain sufficient detail to set forth one embodiment of the present invention.

Referring to FIG. 1, FIG. 2 and FIG. 4, spinning body 2 has mounted thereon a despun antenna 4. Said antenna 4 remains in a fixed angular position relative to some point external to the spinning body 2 and radiates electromagnetic energy generated by communications channel transponder 8. Said signal is received by antenna 14 located at ground terminal 12. The received signal amplitude is detected by narrow band receiver 16 located at terminal 12. The output of receiver 16 is applied to an input of a dual trace strip chart recorder 18. Said recorder 18 is calibrated in decibels.

Furthermore, spinning body 2 contains a master index pulse generator 6. Said index pulse generator 6 produces a pulse once each spin period of body 2. Said index pulse is transmitted to ground terminal 12 by the telemetry and command subsystem 10. The transmitted index pulse is received and detected by the telemetry and command subsystem 20 located at terminal 12. The output master index pulse is then applied to the other input of strip chart recorder 18.

In practice, the telemetry and command subsystem 10 contains a standard telemetry transmitter and modulator. Said subsystem 10 further contains a standard command receiver and command demodulator. Also, the master index pulse generator 6 can be a magnet mounted on despun antenna 4 and a coil mounted on spinning body 2. The telemetry and command subsystem 20 contains a standard telemetry receiver and demodulator and a command modulator and transmitter.

To facilitate understanding of the present invention, a stationary three-dimensional coordinate system on the spinning body is established. The Z axis is colinear with the central axis or spin axis of spinning body 2. The X axis passes through the center of gravity of spinning body 2 and dynamic balancing means 32a in FIGS. 1 and 2 and is perpendicular to the Z axis. The Y axis passes through the center of gravity of spinning body 2 and is perpendicular to both the X axis and Z axis. This axis notation is conventional (see U.S. Pat. No. 3,442,468 to Iorillo) in which the Z axis is the spin axis.

To further facilitate the understanding of the present invention, certain assumptions must be made. The master index pulse generator 6 initiates a pulse once each spin period and at an angular location of $\phi_c$ degrees from the X axis. The antenna 4 has a known, gain slope characteristic expressed in units of decibels per degree. The spinning body 2 is initially dynamically unbalanced with an apparent principal axis 22 at an unknown angle magnitude of $\sigma_1$ degrees to the Z axis and at an unknown phase angle of $\psi_1$ degrees relative to the X axis.

Figure 5:
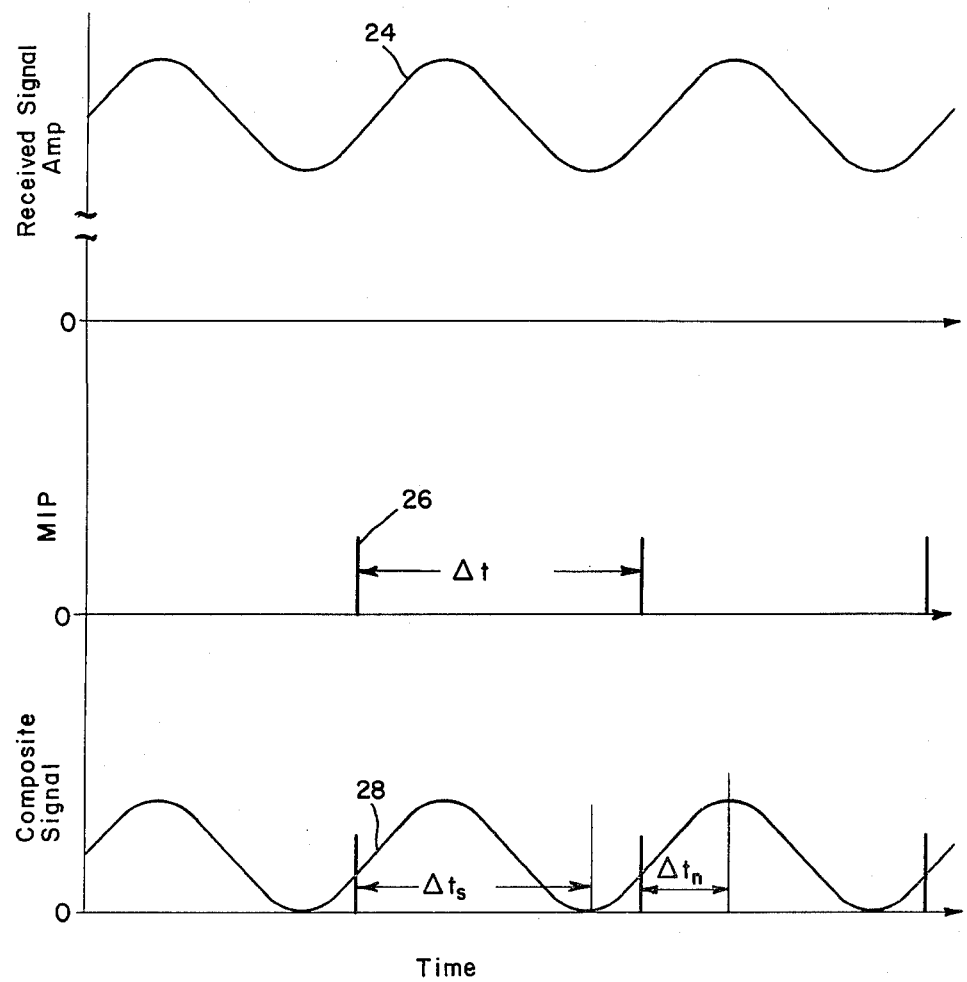
FIG. 5 is a graphic representation of typical waveforms of the strip chart recorder forming part of FIG. 4.

To measure the magnitude $\sigma_1$ and the phase $\psi_1$ of the dynamic imbalance, the attitude of the body 2 is slightly altered by commands from terminal 12 such that the bore sight of antenna 4 is either north or south of antenna 14 of terminal 12. The received amplitude variation in the signal is plotted on strip chart recorder 18 as a function of time. Waveform 24 shown in FIG. 5 is a graphical representation of such a plot. The master index pulses received by telemetry and command subsystem 20 are also plotted on recorder 18 as a function of time. Waveform 26 shown in FIG. 5 is a graphical representation of such a plot.

To calculate the magnitude $\sigma_1$, the peak-to-peak variation in waveform 24 is measured. The result is divided by twice the gain slope characteristic of that portion of the beam of antenna 4 illuminating ground terminal 12.

To calculate the phase $\psi_1$, waveform 26 is superimposed onto waveform 24 to form waveform 28 as shown in FIG. 5. The time interval $\Delta t$ between master index pulses is then measured. This interval $\Delta t$ corresponds to the spin period of body 2. Then, if terminal 12 is illuminated by the northern part of the beam from antenna 4, the time interval $\Delta t_N$ from a master index pulse to the next maximum in waveform 28 is measured. If terminal 12 is looking at the southern part of the beam from antenna 4, the time interval $\Delta t_S$ from a master index pulse to the next minimum in waveform 28 is measured. The phase $\psi_1$ is equal to $\Delta t_S$ or $\Delta t_N$ divided by $\Delta t$ the quantity times three hundred sixty degrees (360°) plus $\psi_c$.

It should be apparent to one skilled in the art that either an earth pulse from the earth sensor or a sun pulse from a sun sensor could be used in lieu of the master index pulse without departing from the spirit and scope of the invention. It should also be apparent that the method for determining the magnitude $\sigma_1$ could be applied to nonspinning bodies which are subject to a rocking or wobbling motion.

To complete the dynamic balancing of the spinning body, balancing commands are developed from the magnitude $\sigma_1$ and phase $\psi_1$. These commands are applied to the command subsystem 20 and are transmitted to spinning body 2. These commands are received by the command subsystem 10 and are demodulated into signals which are applied to the dynamic balancing means 30 thereby dynamically balancing the spinning body. Since the communications channel is used to measure the imbalance, it should be apparent that this method optimizes the communication channel performance.

In a second embodiment of the present invention, the spin rate is changed by utilizing the dynamic balancing means 30 and axial thruster 34. The axial thruster 34 is radially displaced from the Z axis, FIG. 1, and is pointed in the same direction as the Z axis (axially of the Z axis), FIG. 2. Dynamic balancing means 30 comprises a plurality of axially movable masses 32 equidistant from each other.

Figure 3:
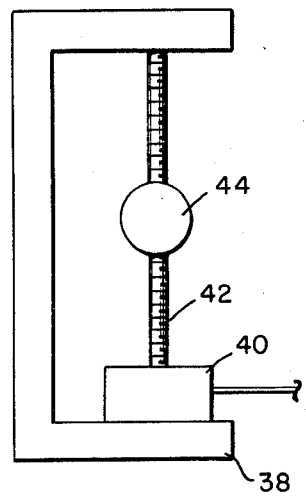
FIG. 3 is a specific implementation of a dynamic balancing means utilized in FIG. 1 and FIG. 2.

In practice, each of the axially movable masses 32 can be as shown in FIG. 3. The movable mass 32 comprises a frame 38 having a reversible electric motor 40 mounted therein. The reversible motor 40 drives a threaded shaft 42 having a threaded mass 44 thereon. Therefore, as motor 40 rotates, mass 44 moves either up or down threaded shaft 42.

In operation, to change spin rate of spinning body 2, a dynamic imbalance of known magnitude $\sigma_2$ and phase $\psi_2$ is created in spinning body 2 by the dynamic balancing means by shifting mass in a direction axially of and parallel to said central axis of said body. This imbalance is created by transmitting the appropriate commands from terminal 12 to spinning body 2. Once the known dynamic imbalance is introduced, the spinning body 2 spins about an apparent principal axis 22 which is at an angle $\sigma_2$ relative to the Z axis. Since thruster 34 is parallel to the Z axis, there is an angle $\sigma_2$ between the thruster and the apparent principal axis 22. Therefore, if thruster 34 is fired, a component Ft of the thrust force F is tangential to body 2 spinning about apparent principal axis 22 and is perpendicular to the projection of the apparent principal axis into the plane of the drawing as seen in FIG. 2. The magnitude of the tangential force is proportional to the sine of the angle $\sigma_2$. By setting the phase angle $\psi_2$ appropriately, the tangential force can be in the direction either of the spin of body 2 thereby increasing the spin rate or against the spin of body 2 thereby decreasing the spin rate.

In a third embodiment of the present invention, the axially movable masses 32 are utilized to shift the center of gravity of spinning body 2 so as to reduce the adverse effects of differential solar pressure. To minimize the effects of solar pressure, the position of the center of solar pressure relative to the center of gravity of the spinning body 2 must be determined. To determine the position of the center of solar pressure, the attitude of the spinning body must be determined at two different times. The attitude at each time is developed from the earth sensor 46 and sun sensor 48 information transmitted by the telemetry and command subsystem 10 to terminal 12. Once the two spin axis attitudes are known (e.g., in an inertial coordinate system), it can be determined if the antenna 4 end of the spinning body 2 is tipping counterclockwise or clockwise as viewed from the sun by comparing the two attitudes. If tipping counterclockwise, the center of solar pressure is axially closer to the antenna 4 end of body 2 than the center of gravity. If tipping clockwise, the center of solar pressure is axially farther from the antenna 4 end of body 2 than the center of gravity. Therefore, once the axial direction is known, all of the movable masses 32 can be axially moved in unison in that axial direction thereby shifting the center of gravity closer to the center of solar pressure. If the center of gravity is moved closer to the center of solar pressure, the effects of solar pressure can be reduced.

In all cases it is understood that the abovedescribed embodiments are merely illustrative of but a small number of the many possible specific embodiments which can represent applications of the principles of the present invention. Numerous and varied other arrangements can be readily devised in accordance with these principles by those skilled in the art without departing from the spirit and scope of the invention.

What is claimed is:

1. The method for changing the spin rate of a body spinning about a central axis, comprising the steps of:
   introducing a dynamic imbalance of a known magnitude and phase by shifting mass in a direction axially of and parallel to said central axis of said body to cause said body to spin about an apparent principal axis at an angle to said central axis; and
   thereafter applying an axial thrust force to said body in a position radially displaced from and parallel to said central axis of said body for changing the spin rate of said body.

2. A method for changing the spin rate of a body spinning about a central axis comprising the ordered steps of:
   introducing solely a dynamic imbalance to said spinning body of a known magnitude and a known phase by shifting mass in a direction axially of and parallel to said central axis of said body so as to cause said body to spin about an apparent principal axis which is at an angle to said central axis of said body; and
   applying a thrust force to said spinning body acting axially of said central axis of said spinning body and radially displaced therefrom, and at an angle to said apparent principal axis, producing a radially displaced component of thrust force acting on said spinning body at an angle to the applied thrust force thereby changing the spin rate of said spinning body about said apparent principal axis.

3. A method for changing the spin rate of a spinning body about a central axis, having a plurality of axially movable masses radially displaced from said central axis of said body in circumferentially spaced positions, and an axial thruster radially displaced from said central axis, comprising the steps of:
   utilizing said axially movable masses to dynamically imbalance said spinning body by shifting mass in a direction axially of and parallel to said central axis of said body, causing said body to spin about an apparent principal axis at an angle to said central axis; and
   thereafter utilizing said axial thruster to apply an axial thrust force to said body radially displaced from and parallel to said central axis and at an angle to said apparent principal axis whereby a tangential component of said axial thrust force acting on said body produces a spin-rate-changing torque to change the spin rate of said body.

* * * * *

UNITED STATES PATENT AND TRADEMARK OFFICE
CERTIFICATE OF CORRECTION

PATENT NO. : 4,470,568
DATED : September 11, 1984
INVENTOR(S) : MURRAY J. NEUFELD It is certified that error appears in the above—identified patent and that said Letters Patent is hereby corrected as shown below:

On the title page, in the heading

Delete "Nuefeld" and insert therefor --Neufeld--

On the title page at [75]

Delete "Nuefeld" and insert therefor --Neufeld--

Signed and Sealed this

Twenty-eighth Day of May 1985

[SEAL]

*Attest:*

DONALD J. QUIGG

*Attesting Officer*    *Acting Commissioner of Patents and Trademarks*